US009575932B2

(12) United States Patent
Wang et al.

(10) Patent No.: US 9,575,932 B2
(45) Date of Patent: Feb. 21, 2017

(54) FLEXIBLE BLOCK ILU FACTORIZATION

(71) Applicant: Landmark Graphics Corporation, Houston, TX (US)

(72) Inventors: Qinghua Wang, Katy, TX (US); Graham Christopher Fleming, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 0 days.

(21) Appl. No.: 14/889,251

(22) PCT Filed: Jan. 31, 2014

(86) PCT No.: PCT/US2014/014244
§ 371 (c)(1),
(2) Date: Nov. 5, 2015

(87) PCT Pub. No.: WO2015/116193
PCT Pub. Date: Aug. 6, 2015

(65) Prior Publication Data
US 2016/0328359 A1    Nov. 10, 2016

(51) Int. Cl.
*G06F 7/00* (2006.01)
*G06F 17/16* (2006.01)
*G06F 17/12* (2006.01)

(52) U.S. Cl.
CPC .............. *G06F 17/16* (2013.01); *G06F 17/12* (2013.01)

(58) Field of Classification Search
CPC .................................. G06F 17/16; G06F 17/12
USPC ........................................................ 708/203
See application file for complete search history.

(56) References Cited

U.S. PATENT DOCUMENTS

| | | | |
|---|---|---|---|
| 6,144,932 A | 11/2000 | Hachiya | |
| 2002/0099748 A1 | 7/2002 | Grosz et al. | |
| 2008/0097730 A1 | 4/2008 | Canning | |
| 2009/0271433 A1 | 10/2009 | Perronnin et al. | |
| 2010/0082724 A1 | 4/2010 | Diyankov et al. | |
| 2012/0022841 A1* | 1/2012 | Appleyard | G06F 17/12 703/2 |
| 2013/0211800 A1* | 8/2013 | Fung | G06F 17/5009 703/2 |
| 2013/0325917 A1* | 12/2013 | Starhill | G06F 17/16 708/200 |

OTHER PUBLICATIONS

Commissioner; International Search Report and the Written Opinion of the International Searching Authority; PCT/US14/14244; Oct. 27 2014; 9 pgs.; ISA/KR.
Premnath, Jason; First Examination Report; dated Jul. 7, 2016; 2 pages; Patent Application No. 2014380241; Australian Intellectual Property Office; Australia.

* cited by examiner

*Primary Examiner* — Tan V. Mai
(74) *Attorney, Agent, or Firm* — Crain, Caton & James; Tenley Krueger

(57) ABSTRACT

Systems and methods for flexible block ILU factorization that will support sparse blocks with variable sizes.

20 Claims, 8 Drawing Sheets

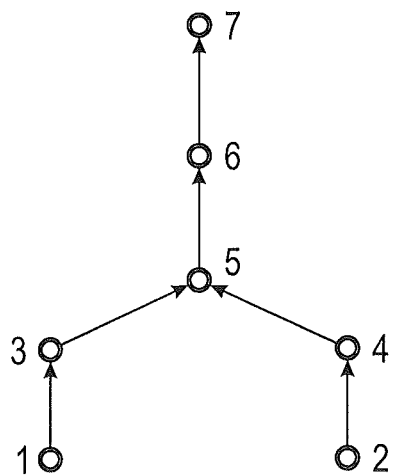 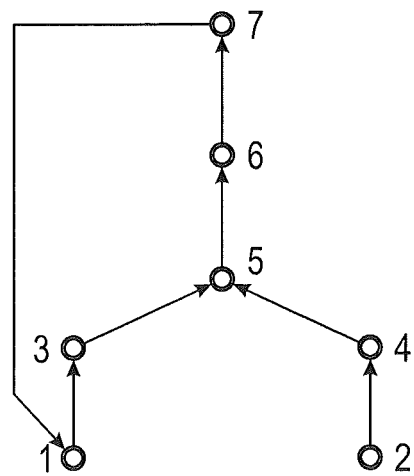
FIG. 1A          FIG. 1B
FIG. 2

| 1 | 3 | 2 | 4 | 1 | 3 | 5 | 2 | 4 | 5 | 1 | 2 | 3 | 4 | 5 | 6 | 5 | 6 | 7 | 1 | 3 | 5 | 6 | 7 |

| 1 | 3 | 5 | 8 | 11 | 17 | 20 | 25 |

FIG. 6

| 1 | 4 | 7 | 10 | 13 | 16 | 19 | 22 |

FLEXIBLE BLOCK ILU FACTORIZATION

CROSS-REFERENCE TO RELATED APPLICATIONS

This application claims the priority of PCT Patent Application No. PCT/US14/14244, filed on Jan. 31, 2014, which is incorporated herein by reference.

STATEMENT REGARDING FEDERALLY SPONSORED RESEARCH

Not applicable.

FIELD OF THE DISCLOSURE

The present invention generally relates to systems and methods for flexible block ILU factorization. More particularly, the present invention relates to flexible block ILU factorization that will support sparse blocks with variable sizes.

BACKGROUND

Many types of physical processes, including fluid flow in a petroleum reservoir, are governed by partial differential equations. These partial differential equations, which can be very complex, are often solved using finite difference, finite volume, or finite element methods. All of these methods divide the physical model into units called gridblocks, cells, or elements. In each of these physical units the solution is given by one or more solution variables or unknowns. Associated with each physical unit is a set of equations governing the behavior of these unknowns, with the number of equations being equal to the number of unknowns. These equations also contain unknowns from neighboring physical units.

Thus, there is a structure to the equations, with the equations for a given physical unit containing unknowns from that physical unit and from its neighbors. This is most conveniently depicted using a combination of nodes and connections, where a node is depicted by a small circle and a connection is depicted by a line between two nodes. The equations at a node contain the unknowns at that node and at the neighboring nodes to which it is connected.

The equations at all nodes are assembled into a single matrix equation. Often the critical task in obtaining the desired solution to the partial differential equations is solving this matrix equation. One of the most effective ways to do this is through the use of incomplete LU factorization or ILU, in which the original matrix is approximately decomposed to the product of two matrices L and U. The matrices L and U are lower triangular and upper triangular and have similar nonzero structures as the lower and upper parts of the original matrix, respectively. With this decomposition, the solution is obtained iteratively by forward and backward substitutions.

The block incomplete LU factorization (BILU) solver has been proved an effective method to solve linear systems resulting from discretization of partial differential equations. In most of the linear systems, the coefficient matrix has dense block sub-matrices as entries. However in the application for oil/gas production surface facilities, those block sub-matrices are sparse. The block sub-matrix might be treated as dense matrix by adding dummy zero terms to the block, but when the block is large and sparse, it might lead to too many dummy entries. For example in a compositional model with 20 hydrocarbon components, such a treatment with dummy entries may increase the matrix size by 10 times, dependent on the hydraulics equations, surface network configurations, active constraint settings and some other factors. Besides that, the number of equations at nodes in some regions may be different from those in other regions, and the resulting block size will vary from region to region. Thus, the conventional BILU with rigid block structures is not a reasonable choice for surface networks.

As shown in FIGS. 1A and 1B, a simple production surface network usually has a tree structure (FIG. 1A) and in some cases includes one or more loops representing, for example, reinjection (FIG. 1B). The governing equations are mass conservation equations on nodes, hydraulics equations on connections, perforation equations on perforation connections and constraint settings on nodes or connections. The primary variables are pressure P and component compositions $x_i$ on nodes with two sets of auxiliary variables, total mass flow rate $q_T$ on active connections and component flow rates $q_{fi}$ on perforation connections. But the auxiliary variables are eliminated when a Jacobian matrix is assembled, and the final coefficient matrix comprises only mass balance equations with the primary variables P and $x_i$, wherein i=1, . . . , nc−1, and nc is the total number of components. The primary variables are labeled continuously on each node so each node has an unknown vector v consisting of pressure and compositions as follows:

$$v = \begin{bmatrix} x_1 \\ x_2 \\ \vdots \\ x_{nc-1} \\ P \end{bmatrix}.$$

The resulting coefficient matrix is illustrated in FIG. 2, which possesses a block structure wherein connection patterns between the blocks represent the physical connections between nodes in the production surface network of FIG. 1B with some virtual connections. The coefficient matrix is not symmetric in incidence. Each row of entries [x] in FIG. 2 represents a mass balance equation and each block row represents a cluster of three mass balance equations related to a respective physical node in FIG. 1B. Because there are seven physical nodes in FIG. 1B, there are seven block rows in FIG. 2. Each entry [x] has a coefficient value and also represents a connection between the physical nodes through the mass balance equation. The elimination of total flow rates may introduce fill-ins in the coefficient matrix as shown in FIG. 2. Because the fill-ins do not exist in the original production surface network connections, they are referred to as virtual connections. For example, in FIG. 2 there is a one way virtual connection from node 5 to node 1, which corresponds to the 15$^{th}$ row in the coefficient matrix, after the total flow rates on connections 1-3 and 3-5 are eliminated although there is no physical connection between node 5 and node 1 in FIG. 1.

Given the coefficient matrix illustrated in FIG. 2, a sparse direct solver may be applied, but it comes with a high cost in computation and storage due to tremendous fill-ins, especially for a matrix resulting from large surface networks with complex configurations and constraint settings. An obvious alternative is the ILU type iterative solver, and its performance may be improved using blocking methods. However, for the production surface network equations, it is difficult to divide the matrix to obtain the block structure with dense or close to dense blocks.

BRIEF DESCRIPTION OF THE DRAWINGS

The present disclosure is described below with references to the accompanying drawings in which like elements are referenced with like reference numerals, and in which:

FIG. 1A is a schematic display illustrating a simple production surface network.

FIG. 1B is a schematic display illustrating the production surface network in FIG. 1A with an additional reinjection loop.

FIG. 2 is a coefficient matrix illustrating a representation of the linearized partial differential equations governing the fluid flow in the production surface network in FIG. 1B.

FIG. 4A is an adjacency matrix illustrating the connection patterns between the blocks that represent the physical and virtual connections between nodes in the production surface network in FIG. 1B.

FIG. 4B is the adjacency matrix in FIG. 4A illustrating a fill-in pattern determined by symbolic factorization after reordering all nodes represented in FIG. 4A.

FIG. 5 is a column_index (top) and a first_in_row index (bottom) illustrating the connections in FIG. 4B stored in a CSR format.

FIG. 6 is a row_in_block row index illustrating steps 318-324 in FIG. 3.

DETAILED DESCRIPTION OF THE PREFERRED EMBODIMENTS

Figure 3A:
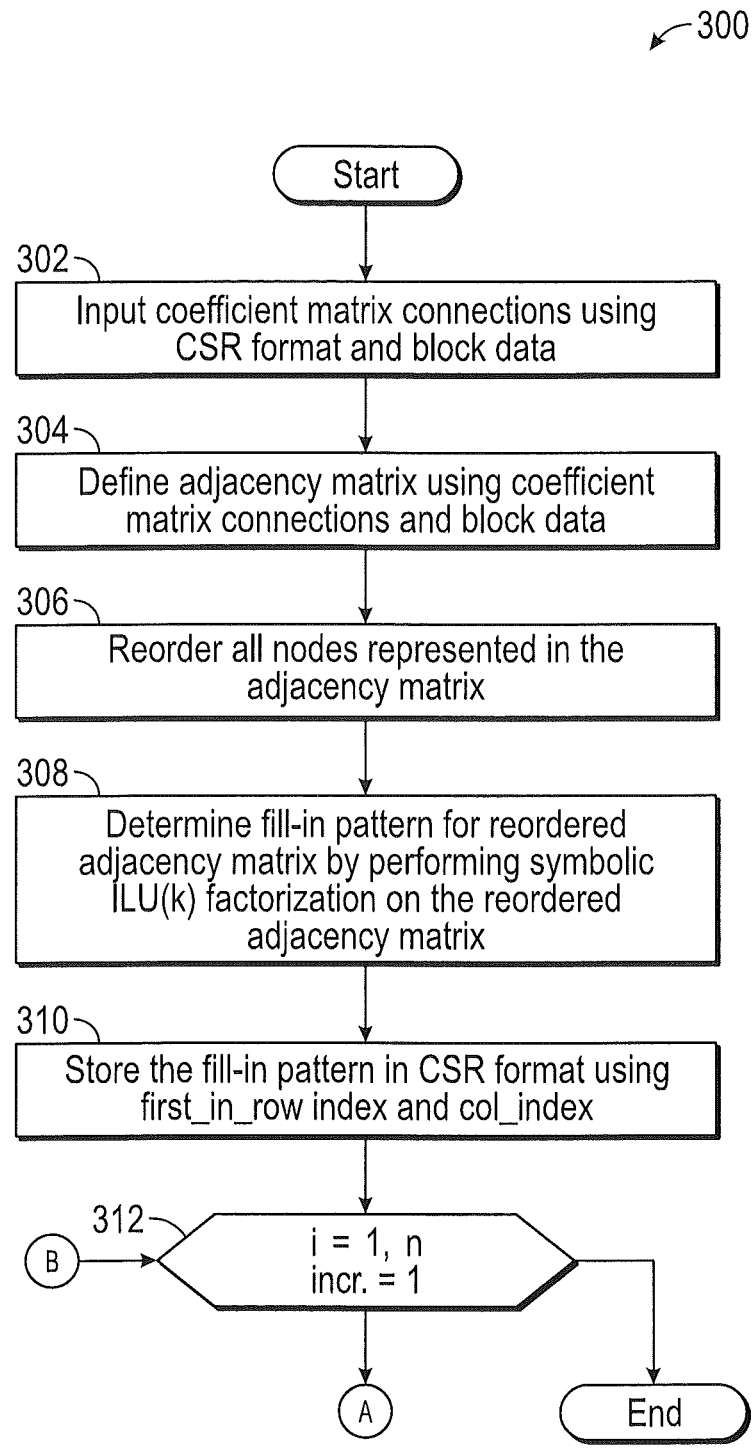
FIG. 3A is a flow diagram illustrating one embodiment of a method for implementing the present disclosure.
Figure 3B:
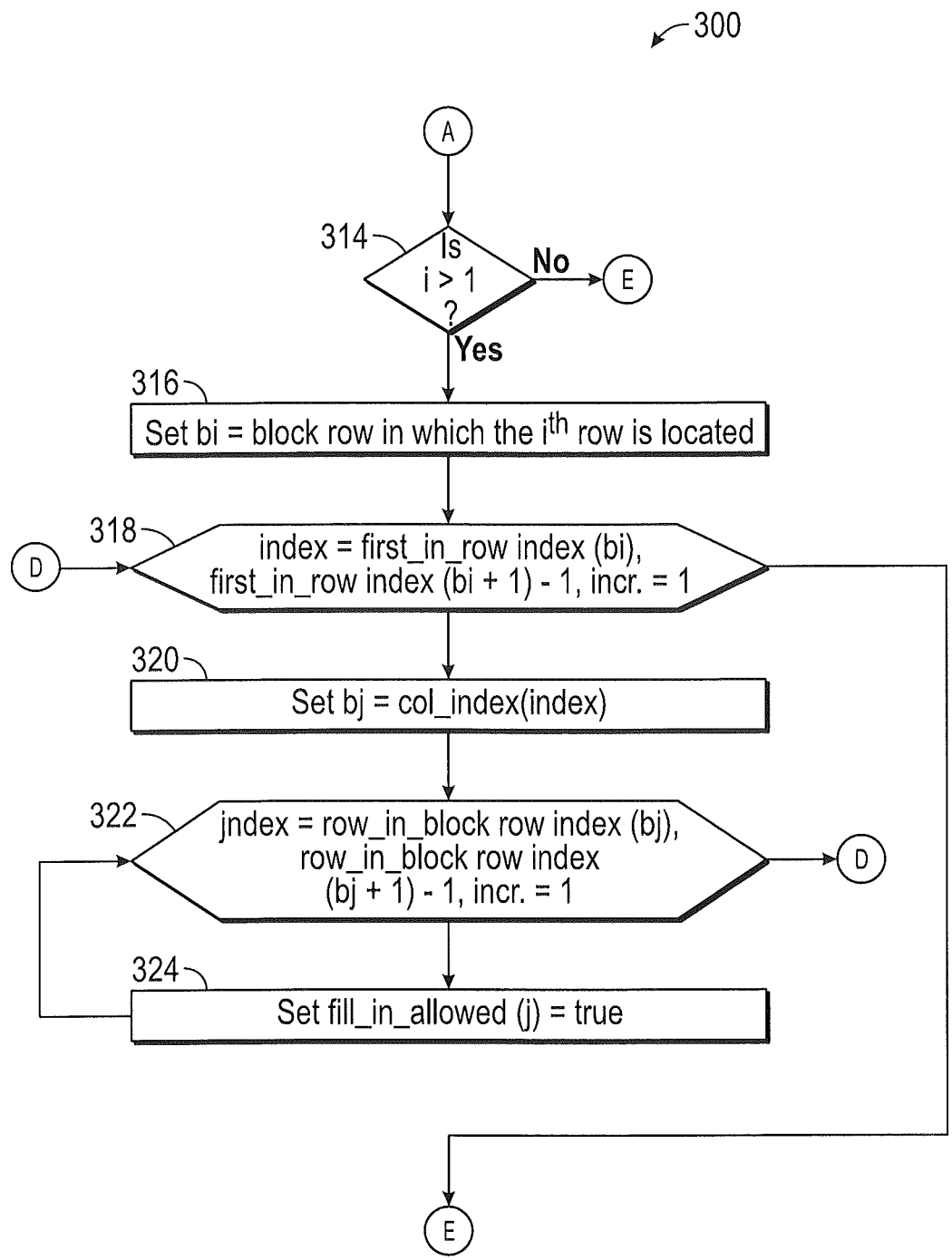
FIG. 3B is a continuation of the flow diagram illustrated in FIG. 3A.

The present disclosure overcomes one or more deficiencies in the prior art by providing systems and methods for flexible block ILU factorization that will support sparse blocks with variable sizes.

In one embodiment, the present disclosure includes a method for flexible block ILU factorization, which comprises: i) defining an adjacency matrix representing multiple physical nodes in a production surface network using each physical connection and each virtual connection in a coefficient matrix and block data for the coefficient matrix, the adjacency matrix comprising multiple blocks; ii) reordering each physical node in the adjacency matrix; iii) performing a symbolic factorization to determine a fill-in pattern for the reordered adjacency matrix, wherein each fill-in is located in one of i) inside one of the blocks in the reordered adjacency matrix and ii) outside of the blocks in the reordered adjacency matrix; and iv) performing a numerical ILU factorization on the coefficient matrix using each fill-in from the fill-in pattern and a computer processor, wherein each fill-in located in one of the blocks is kept and each fill-in located outside of the blocks is discarded.

In another embodiment, the present disclosure includes a non-transitory program carrier device tangibly carrying computer executable instructions for flexible block ILU factorization, the instructions being executable to implement: i) defining an adjacency matrix representing multiple physical nodes in a production surface network using each physical connection and each virtual connection in a coefficient matrix and block data for the coefficient matrix, the adjacency matrix comprising multiple blocks; ii) reordering each physical node in the adjacency matrix; iii) performing a symbolic factorization to determine a fill-in pattern for the reordered adjacency matrix, wherein each fill-in is located in one of i) inside one of the blocks in the reordered adjacency matrix and ii) outside of the blocks in the reordered adjacency matrix; and iv) performing a numerical ILU factorization on the coefficient matrix using each fill-in from the fill-in pattern, wherein each fill-in located in one of the blocks is kept and each fill-in located outside of the blocks is discarded.

In yet another embodiment, the present disclosure includes a non-transitory program carrier device tangibly carrying computer executable instructions for flexible block ILU factorization, the instructions being executable to implement: i) defining an adjacency matrix representing multiple physical nodes in a production surface network using each physical connection and each virtual connection in a coefficient matrix and block data for the coefficient matrix, the adjacency matrix comprising multiple blocks; ii) reordering each physical node in the adjacency matrix; iii) performing a symbolic factorization to determine a fill-in pattern for the reordered adjacency matrix, wherein each fill-in represents one of a physical connection and a virtual connection and is located in one of i) inside one of the blocks in the reordered adjacency matrix and ii) outside of the blocks in the reordered adjacency matrix; and iv) performing a numerical ILU factorization on the coefficient matrix using each fill-in from the fill-in pattern, wherein each fill-in located in one of the blocks is kept and each fill-in located outside of the blocks is discarded.

The subject matter of the present disclosure is described with specificity, however, the description itself is not intended to limit the scope of the disclosure. The subject matter thus, might also be embodied in other ways, to include different steps or combinations of steps similar to the ones described herein, in conjunction with other present or future technologies. Moreover, although the term "step" may be used herein to describe different elements of methods employed, the term should not be interpreted as implying any particular order among or between various steps herein disclosed unless otherwise expressly limited by the description to a particular order. While the present disclosure may be applied in the oil and gas industry, it is not limited thereto and may also be applied in other industries to achieve similar results.

Method Description

Referring now to FIGS. 3A-3E, a flow diagram of one embodiment of a method 300 for implementing the present disclosure is illustrated.

Figure 7:
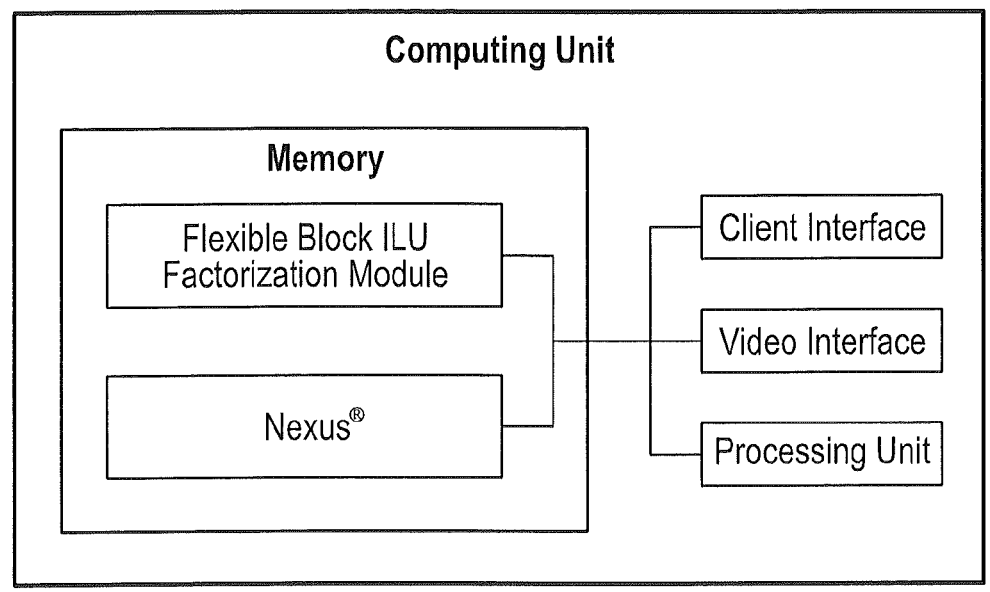
FIG. 7 is a block diagram illustrating one embodiment of a computer system for implementing the present disclosure.

In step 302, connections for a coefficient matrix are automatically input using a Compressed Sparse Row (CSR) format and block data or they may be manually input using the client interface and/or the video interface described further in reference to FIG. 7. In FIG. 2, for example, the connections for the coefficient matrix represented by each entry [x] are input using the CSR format ((first_in_row index), (col._index)) and the block data (row_in_block row_in_block index). The block data stores the row indices or equation indices that belong to the same node in the coefficient matrix. As shown by FIG. 2, rows 1-3 in the coefficient matrix belong to block row 1 (i.e. node 1), rows 4-6 belong to block row 2 (i.e. node 2), and so on. Thus, the first row for each block row in the coefficient matrix is represented as an entry in the row_in_block row index of FIG. 6 wherein the last entry is 22 to designate the end of the 21 rows.

Figures 4A, 4B:
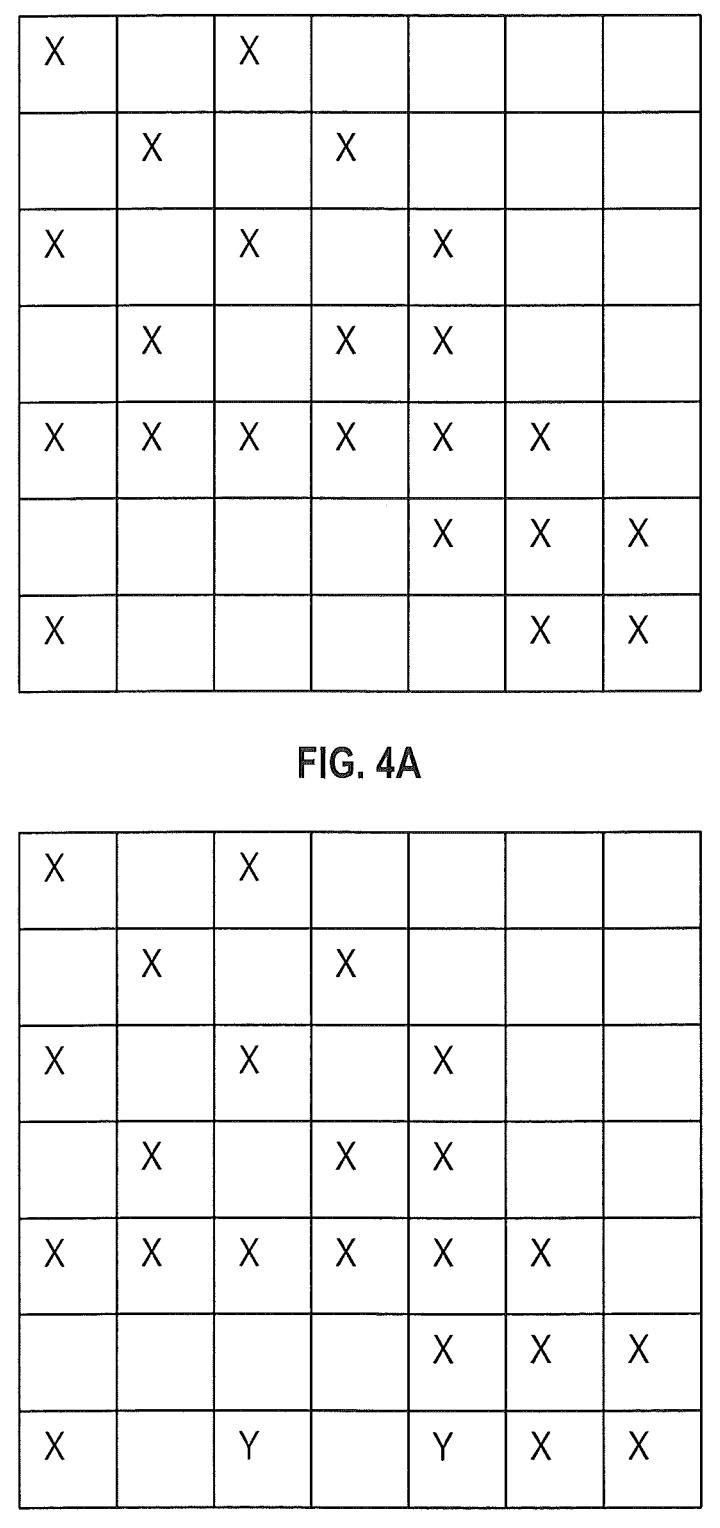

In step 304, an adjacency matrix is defined using the coefficient matrix connections and the block data. In FIG. 4A, for example, the adjacency matrix was defined using the coefficient matrix connections and block data for the connections in FIG. 2. The adjacency matrix illustrates the connection patterns between the blocks wherein each entry [x] represents a physical or virtual connection between nodes in the production surface network in FIG. 1B.

In step 306, all nodes represented in the adjacency matrix are reordered using techniques well known in the art such as, for example, Cuthill-Mckee ordering. The reordering starts with perforation nodes at the bottom and will reduce the number of fill-ins required as a result of symbolic ILU(k) factorization.

In step 308, a fill-in pattern is determined for the reordered adjacency matrix by performing symbolic ILU(k) factorization on the reordered adjacency matrix. After the nodes represented in FIG. 4A are reordered, symbolic ILU(k) factorization is performed on the reordered adjacency matrix to determine a fill-in pattern as illustrated by each level 2 fill-in entry [y] in FIG. 4B, for example.

In step 310, the fill-in pattern is stored in the CSR format using the first_in_row index and the col._index. In FIG. 5, for example, a col._index (top) and a first_in_row index (bottom) illustrates the connections in FIG. 4B stored in a CSR format. The col._index represents the column in which each physical or virtual connection represented by an entry [x or y] in FIG. 4B is located starting from left to right (columns) and from top to bottom (rows). The first_in_row index represents the physical or virtual connection represented by an entry [x or y] appearing first in each row starting from top to bottom. The first connection in the first row is 1, the first connection in the second row is 3, the first connection in the third row is 5 and so on. The last connection is 25 to designate the end of the connections.

In step 312, the method 300 initiates a loop beginning with i=1, which is incremented by 1, and ending with i=n wherein i represents a row index number and n represents the total number of rows in the coefficient matrix. The row index number represents a row of coefficient entries resulting from a linearized mass balance equation in the coefficient matrix. For the coefficient matrix in FIG. 2, the total number of rows is 21. In this manner, the method 300 begins a procedure of numerical factorization that is performed row by row on the coefficient matrix. After i=21, the method 300 ends. Otherwise, the method 300 proceeds to step 314 in FIG. 3B.

In step 314, the method 300 determines if i is greater than 1. If i is not greater than 1 (i.e. the first row), then the method 300 proceeds to step 326 because it does not need to be factored. If i is greater than 1, then the method 300 proceeds to step 316.

In step 316, bi is set equal to the block row in which the ith row is located. If i=2, then bi=1.

In step 318, the method 300 initiates a loop beginning with index=first_in_row index (bi), which is incremented by 1, and ending with index=first_in_row index (bi+1)−1. After index exceeds first_in_row index (bi+1)−1, the method 300 proceeds to step 326 in FIG. 3C. Otherwise, the method 300 proceeds to step 320. If i=2, then bi=1 and index=first_in_row index (1) or 1 according to the first_in_row index (bottom) in FIG. 5.

In step 320, bj is set equal to col_index (index). If i=2, then bj=the same block row as the block row for bi including entries 1,3.

In step 322, the method 300 initiates a loop beginning with jndex=row_in_block row index (bj), which is incremented by 1, and ending with jndex=row_in_block row index (bj+1)−1. The method 300 repeats step 324 until jndx reaches row_in_block row index (bj+1)−1 and then returns to step 318.

In step 324, fill_in_allowed (j) is set equal to true. If i=2, then bi=1, bj=1 and the first entry in the first_in_row index=1. In step 322, row_in_block row index (1)=1 and row_in_block row index (2)=4 according to FIG. 6. Thus, j varies from 1 to 3 and fill_in_allowed (1), fill_in_allowed (2), and fill_in_allowed (3) are set true.

Figure 8:
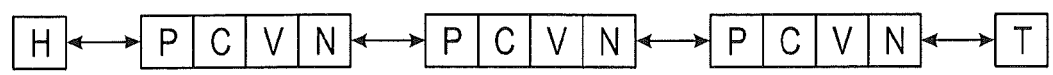
FIG. 8 is an example of a double linked list illustrating a head H, a tail T, a previous index (P), a next index (N), a column index of entries (C), and a coefficient value (V).

In step 326, the entries in the coefficient matrix in the ith row are loaded to a double linked list (LL) in the order of increasing column index and head is set equal to the first entry in the LL. The double linked list contains four elements: 1) LL % prev, which represents the previous index (P); 2) LL % next, which represents the next index (N); 3) LL % col_index, which represents the column index of entries (C); and 4) LL % coef, which represents the coefficient value (V). An example of a LL is illustrated in FIG. 8, which includes the head H, the tail T and the four elements P,C,V,N.

In step 328, the method 300 determines if i is greater than 1. If i is not greater than 1 (i.e. the first row), then the method 300 proceeds to step 329. If i is greater than 1, then the method 300 skips the first row and proceeds to step 330 because the first row does not need to be factored.

In step 329, heath is set equal to 0 and current is set equal to head. Head1 is set to 0 in order to skip step 332 and proceed to step 333 because the first row does not need to be factored.

In step 330, head1 is set equal to head and current is set equal to head.

In step 332, the method 300 determines if head1 is greater than 0. If head1 is not greater than 0, then the method 300 proceeds to step 333 in FIG. 3E. If head1 is greater than 0, then the method 300 proceeds to step 334.

In step 333, all entries in the LL are moved to the ith row of M and the method returns to step 312 to repeat using the next increment for i. M represents a matrix for storing the LU factorization of the coefficient matrix as a result of steps 312-354. The entries that are moved are those from step 352.

In step 334, k is set equal to LL(head1) % col_index.

In step 336, the method 300 determines if k is less than i. If k is not less than i, then the method 300 proceeds to step 354 in FIG. 3D. If k is less than i, then the method 300 proceeds to step 338.

In step 338, B is set equivalent of LL(head1) % coef wherein B is updated by $B/M_{kk}$ and $M_{kk}$ is the entry at row k and column k of matrix M.

In step 340, the method 300 initiates a loop beginning with index=M % first_in_row index (k), which is incremented by 1, and ending with index=M % first_in_row index (k+1)−1. After index exceeds M % first_in_row index (k+1)−1, the method 300 proceeds to step 354 in FIG. 3D.

Otherwise, the method 300 proceeds to step 342. This loop visits all entries in row k of matrix M.

In step 342, j is set equal to M % col(index). This step sets the column index for j.

In step 344, the method 300 determines if j is greater than k and if fill_in_allowed (j) equals true. If either j is not greater than k or fill_in_allowed (j) does not equal true, then the method 300 returns to step 340. If j is greater than k and fill_in_allowed (j) does equal true, then the method 300 proceeds to step 346. The factorization needs to access the upper triangular matrix U of M, so j must be greater than k. In addition, fill_in_allowed (j) is checked for true from step 324.

In step 346, the LL is searched to find an entry with column index j.

In step 348, the method 300 determines if an entry in the LL with column index j was found. If an entry in the LL with column index j was found, then the method 300 proceeds to step 352. If an entry in the LL with column index j was not found, then the method 300 proceeds to step 350. The new entry with column index j is called a fill-in for ILU factorization.

In step 350, a new entry (fill-in) is added to the LL, which uses a well-known insert operation of a doubly linked list. As illustrated by the LL in FIG. 8, a new entry includes pointers (P and N) and a column index of entries C (j here).

In step 352, LL(current) % coef is set equal to LL(current) % coef-B($M_{kj}$). This step updates the value of the new entry in the LL from step 350.

Figure 3C:
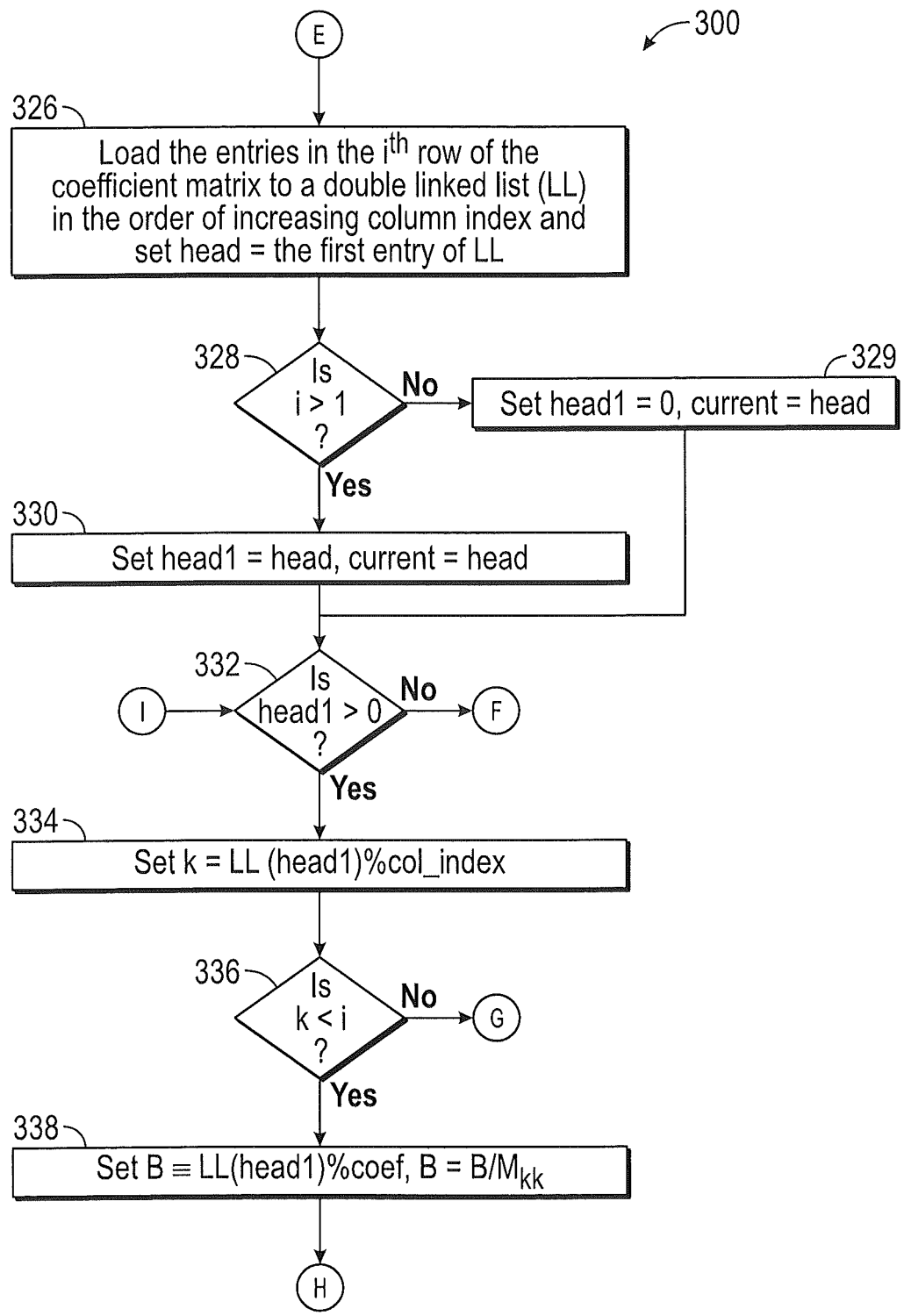
FIG. 3C is a continuation of the flow diagram illustrated in FIG. 3B.
Figure 3D:
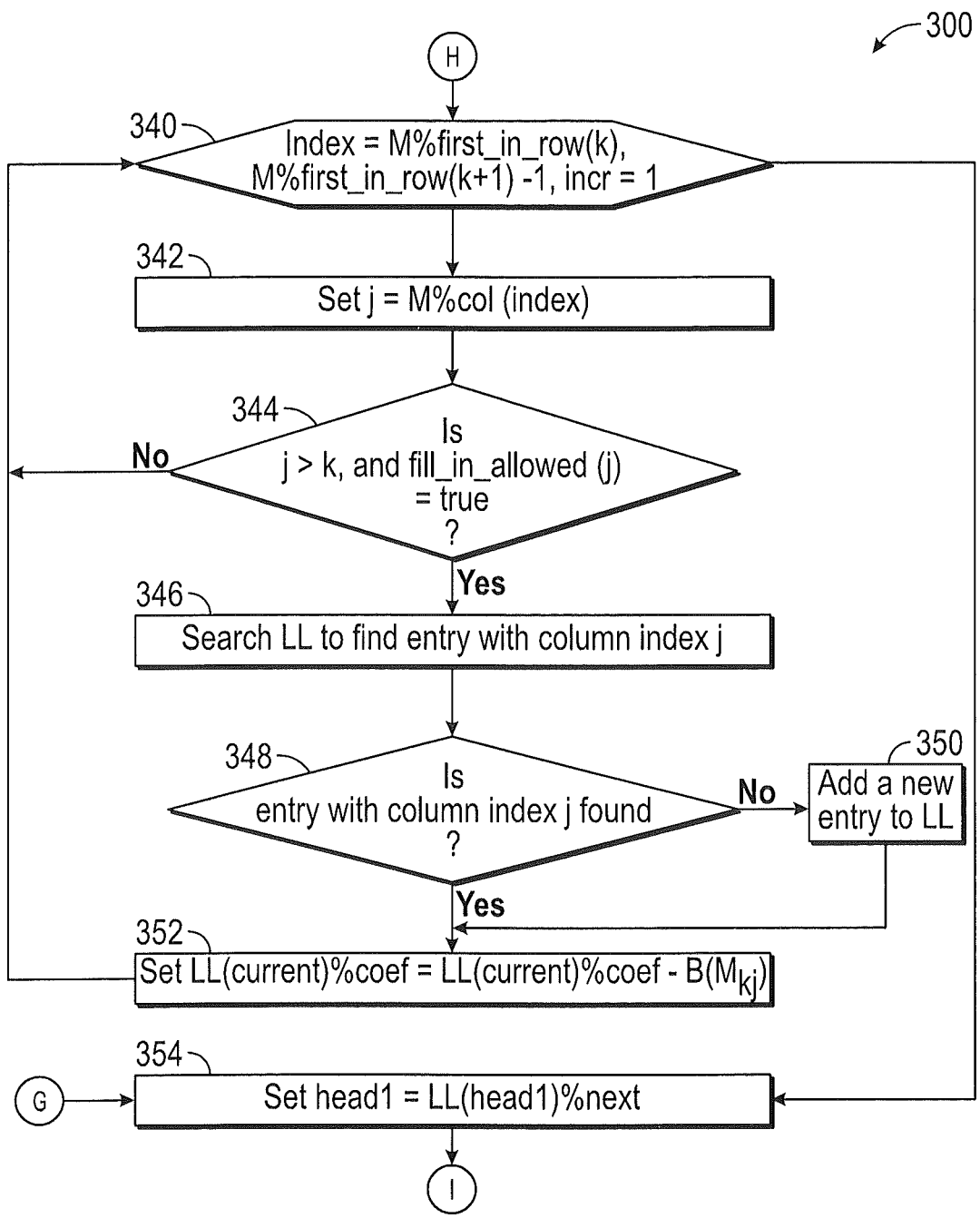
FIG. 3D is a continuation of the flow diagram illustrated in FIG. 3C.
Figure 3E:
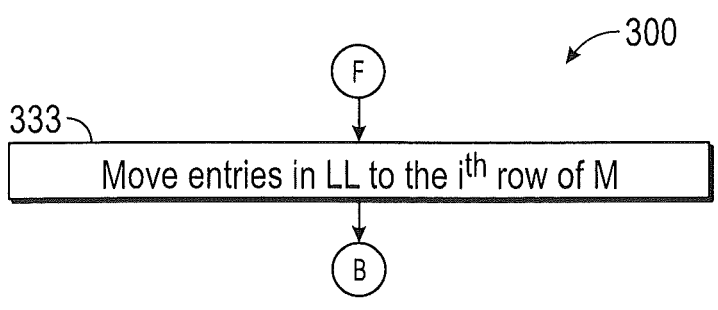
FIG. 3E is a continuation of the flow diagram illustrated in FIG. 3D.

In step 354, head1 is set equal to LL(head1) % next and the method 300 returns to step 332 in FIG. 3C. In this manner, the pointer head1 can move downstream and upstream. For example, its current location is head1 and its downstream neighbor is LL(head1) % next, and its upstream neighbor is LL(head1) % prev.

The method 300 maintains the original physical connections in the production surface network wherein the resulting adjacency matrix resembles the physical connection patterns. The method 300 preserves the original tree structure of the production surface network, which helps reduce fill-ins in the factorization or gives a more accurate factorization with the same fill-in levels. Another advantage of the method 300 is that the resulting coefficient matrix represents mass conservations at each node. If a complete factorization is made for the block on each node, the iterative solver needs only to handle the flow transport between the nodes with the on-node mass distribution treated accurately. With these advantages, the method 300 is more efficient in performance than the conventional ILU solver.

System Description

The present disclosure may be implemented through a computer-executable program of instructions, such as program modules, generally referred to as software applications or application programs executed by a computer. The software may include, for example, routines, programs, objects, components and data structures that perform particular tasks or implement particular abstract data types. The software forms an interface to allow a computer to react according to a source of input. Nexus™, which is a commercial software application marketed by Landmark Graphics Corporation, may be used as an interface application to implement the present disclosure. The software may also cooperate with other code segments to initiate a variety of tasks in response to data received in conjunction with the source of the received data. The software may be stored and/or carried on any variety of memory such as CD-ROM, magnetic disk, bubble memory and semiconductor memory (e.g. various types of RAM or ROM). Furthermore, the software and its results may be transmitted over a variety of carrier media such as optical fiber, metallic wire and/or through any of a variety of networks, such as the Internet.

Moreover, those skilled in the art will appreciate that the disclosure may be practiced with a variety of computer-system configurations, including hand-held devices, multi-processor systems, microprocessor-based or programmable-consumer electronics, minicomputers, mainframe computers, and the like. Any number of computer-systems and computer networks are acceptable for use with the present disclosure. The disclosure may be practiced in distributed-computing environments where tasks are performed by remote-processing devices that are linked through a communications network. In a distributed-computing environment, program modules may be located in both local and remote computer-storage media including memory storage devices. The present disclosure may therefore, be implemented in connection with various hardware, software or a combination thereof, in a computer system or other processing system.

Referring now to FIG. 7, a block diagram illustrates one embodiment of a system for implementing the present disclosure on a computer. The system includes a computing unit, sometimes referred to as a computing system, which contains memory, application programs, a client interface, a video interface, and a processing unit. The computing unit is only one example of a suitable computing environment and is not intended to suggest any limitation as to the scope of use or functionality of the disclosure.

The memory primarily stores the application programs, which may also be described as program modules containing computer-executable instructions, executed by the computing unit for implementing the present disclosure described herein and illustrated in FIGS. 3A-3E. The memory therefore, includes a flexible block ILU factorization module, which enables step 300-354 described in reference to FIGS. 3A-3E. The flexible block ILU factorization module may integrate functionality from the remaining application programs illustrated in FIG. 7. In particular, Nexus™ may be used as an interface application to perform the remaining steps in FIGS. 3A-3E. Although Nexus™ may be used as interface application, other interface applications may be used, instead, or the flexible block ILU factorization module may be used as a stand-alone application.

Although the computing unit is shown as having a generalized memory, the computing unit typically includes a variety of computer readable media. By way of example, and not limitation, computer readable media may comprise computer storage media and communication media. The computing system memory may include computer storage media in the form of volatile and/or nonvolatile memory such as a read only memory (ROM) and random access memory (RAM). A basic input/output system (BIOS), containing the basic routines that help to transfer information between elements within the computing unit, such as during start-up, is typically stored in ROM. The RAM typically contains data and/or program modules that are immediately accessible to, and/or presently being operated on, the processing unit. By way of example, and not limitation, the computing unit includes an operating system, application programs, other program modules, and program data.

The components shown in the memory may also be included in other removable/nonremovable, volatile/nonvolatile computer storage media or they may be implemented in the computing unit through an application program interface ("API") or cloud computing, which may reside on a separate computing unit connected through a computer system or network. For example only, a hard disk drive may read from or write to nonremovable, nonvolatile magnetic media, a magnetic disk drive may read from or write to a removable, nonvolatile magnetic disk, and an optical disk drive may read from or write to a removable, nonvolatile optical disk such as a CD ROM or other optical media. Other removable/nonremovable, volatile/nonvolatile computer storage media that can be used in the exemplary operating environment may include, but are not limited to, magnetic tape cassettes, flash memory cards, digital versatile disks, digital video tape, solid state RAM, solid state ROM, and the like. The drives and their associated computer storage media discussed above provide storage of computer readable instructions, data structures, program modules and other data for the computing unit.

A client may enter commands and information into the computing unit through the client interface, which may be input devices such as a keyboard and pointing device, commonly referred to as a mouse, trackball or touch pad. Input devices may include a microphone, joystick, satellite dish, scanner, or the like. These and other input devices are often connected to the processing unit through the client interface that is coupled to a system bus, but may be connected by other interface and bus structures, such as a parallel port or a universal serial bus (USB).

A monitor or other type of display device may be connected to the system bus via an interface, such as a video interface. A graphical user interface ("GUI") may also be used with the video interface to receive instructions from the client interface and transmit instructions to the processing unit. In addition to the monitor, computers may also include other peripheral output devices such as speakers and printer, which may be connected through an output peripheral interface.

Although many other internal components of the computing unit are not shown, those of ordinary skill in the art will appreciate that such components and their interconnection are well known.

While the present disclosure has been described in connection with presently preferred embodiments, it will be understood by those skilled in the art that it is not intended to limit the disclosure to those embodiments. It is therefore, contemplated that various alternative embodiments and modifications may be made to the disclosed embodiments without departing from the spirit and scope of the disclosure defined by the appended claims and equivalents thereof.

The invention claimed is:

1. A method for flexible block ILU factorization, which comprises:
    defining an adjacency matrix representing multiple physical nodes in a production surface network using each physical connection and each virtual connection in a coefficient matrix and block data for the coefficient matrix, the adjacency matrix comprising multiple blocks;
    reordering each physical node in the adjacency matrix;
    performing a symbolic factorization to determine a fill-in pattern for the reordered adjacency matrix, wherein each fill-in is located in one of i) inside one of the blocks in the reordered adjacency matrix and ii) outside of the blocks in the reordered adjacency matrix; and
    performing a numerical ILU factorization on the coefficient matrix using each fill-in from the fill-in pattern and a computer processor, wherein each fill-in located in one of the blocks is kept and each fill-in located outside of the blocks is discarded.

2. The method of claim 1, wherein each physical connection and each virtual connection in the coefficient matrix is stored in a compressed sparse row format and the block data stores one of row indices and equation indices that belong to a same node.

3. The method of claim 1, wherein each fill-in represents one of a physical connection and a virtual connection.

4. The method of claim 1, wherein one or more connection patterns between the multiple blocks represents at least one of the physical connection(s) and the virtual connection(s) between the nodes in the production surface network.

5. The method of claim 1, wherein the fill-in pattern is stored in a compressed sparse row format using a first-in-row index and a column-index.

6. The method of claim 5, wherein the column index represents a column index in which each physical connection and each virtual connection is located and the first-in-row index represents one of the physical connection and the virtual connection appearing first in each row of the factored, reordered adjacency matrix.

7. The method of claim 1, wherein original connections between the physical nodes in the production surface network are maintained after performing the numerical ILU factorization and the factored, reordered adjacency matrix represents one or more connection patterns between the physical nodes in the production surface network.

8. A non-transitory program carrier device tangibly carrying computer-executable instructions for flexible block ILU factorization, the instructions being executable to implement:
    defining an adjacency matrix representing multiple physical nodes in a production surface network using each physical connection and each virtual connection in a coefficient matrix and block data for the coefficient matrix, the adjacency matrix comprising multiple blocks;
    reordering each physical node in the adjacency matrix;
    performing a symbolic factorization to determine a fill-in pattern for the reordered adjacency matrix, wherein each fill-in is located in one of i) inside one of the blocks in the reordered adjacency matrix and ii) outside of the blocks in the reordered adjacency matrix; and
    performing a numerical ILU factorization on the coefficient matrix using each fill-in from the fill-in pattern, wherein each fill-in located in one of the blocks is kept and each fill-in located outside of the blocks is discarded.

9. The program carrier device of claim 8, wherein each physical connection and each virtual connection in the coefficient matrix is stored in a compressed sparse row format and the block data stores one of row indices and equation indices that belong to a same node.

10. The program carrier device of claim 8, wherein each fill-in represents one of a physical connection and a virtual connection.

11. The program carrier device of claim 8, wherein one or more connection patterns between the multiple blocks represents at least one of the physical connection(s) and the virtual connection(s) between the nodes in the production surface network.

12. The program carrier device of claim 8, wherein the fill-in pattern is stored in a compressed sparse row format using a first-in-row index and a column-index.

13. The program carrier device of claim 12, wherein the column index represents a column index in which each physical connection and each virtual connection is located and the first-in-row index represents one of the physical connection and the virtual connection appearing first in each row of the factored, reordered adjacency matrix.

14. The program carrier device of claim 8, wherein original connections between the physical nodes in the production surface network are maintained after performing the numerical ILU factorization and the factored, reordered adjacency matrix represents one or more connection patterns between the physical nodes in the production surface network.

15. A non-transitory program carrier device tangibly carrying computer-executable instructions for flexible block ILU factorization, the instructions being executable to implement:
   defining an adjacency matrix representing multiple physical nodes in a production surface network using each physical connection and each virtual connection in a coefficient matrix and block data for the coefficient matrix, the adjacency matrix comprising multiple blocks;
   reordering each physical node in the adjacency matrix;
   performing a symbolic factorization to determine a fill-in pattern for the reordered adjacency matrix, wherein each fill-in represents one of a physical connection and a virtual connection and is located in one of i) inside one of the blocks in the reordered adjacency matrix and ii) outside of the blocks in the reordered adjacency matrix; and
   performing a numerical ILU factorization on the coefficient matrix using each fill-in from the fill-in pattern, wherein each fill-in located in one of the blocks is kept and each fill-in located outside of the blocks is discarded.

16. The program carrier device of claim 15, wherein each physical connection and each virtual connection in the coefficient matrix is stored in a compressed sparse row format and the block data stores one of row indices and equation indices that belong to a same node.

17. The program carrier device of claim 15, wherein one or more connection patterns between the multiple blocks represents at least one of the physical connection(s) and the virtual connection(s) between the nodes in the production surface network.

18. The program carrier device of claim 15, wherein the fill-in pattern is stored in a compressed sparse row format using a first-in-row index and a column-index.

19. The program carrier device of claim 18, wherein the column index represents a column index in which each physical connection and each virtual connection is located and the first-in-row index represents one of the physical connection and the virtual connection appearing first in each row of the factored, reordered adjacency matrix.

20. The program carrier device of claim 15, wherein original connections between the physical nodes in the production surface network are maintained after performing the numerical ILU factorization and the factored, reordered adjacency matrix represents one or more connection patterns between the physical nodes in the production surface network.

* * * * *